United States Patent [19]

Colli et al.

[11] Patent Number: 5,825,218
[45] Date of Patent: Oct. 20, 1998

[54] DRIVER CIRCUIT INCLUDING SLEW RATE CONTROL SYSTEM WITH IMPROVED VOLTAGE RAMP GENERATOR

[75] Inventors: Gianluca Colli, Santa Clara; Massimiliano Brambilla, San Jose, both of Calif.

[73] Assignee: STMicroelectronics, Inc., Carrollton, Tex.

[21] Appl. No.: 736,524

[22] Filed: Oct. 24, 1996

[51] Int. Cl.⁶ .................................................. H03K 3/00
[52] U.S. Cl. ..................... 327/112; 327/108; 327/132; 327/134; 327/374; 327/377; 327/403
[58] Field of Search ................................. 327/108, 110, 327/112, 132, 134, 170, 374, 377, 392, 403, 404, 405, 538, 540

[56] References Cited

U.S. PATENT DOCUMENTS

| | | | |
|---|---|---|---|
| 5,177,374 | 1/1993 | Carpenter et al. | 307/270 |
| 5,191,269 | 3/1993 | Carobolante . | |
| 5,306,988 | 4/1994 | Carobolante et al. | 318/254 |
| 5,374,857 | 12/1994 | Carobolante . | |
| 5,512,854 | 4/1996 | Park | 327/374 |
| 5,514,939 | 5/1996 | Schlager et al. | 318/254 |
| 5,627,487 | 5/1997 | Keeth | 327/112 |
| 5,712,509 | 2/1998 | Chan | 327/112 |
| 5,739,707 | 4/1998 | Barraclough | 327/112 |

OTHER PUBLICATIONS

Gariboldi, "Motion Control," appearing in *Smart ICs*, Murari et al., Eds., 1995, Ch. 5, pp. 225–283.

Grebene, *Bipolar and MOS Analog Integrated Circuit Designs*, 1984, Sec. 4.1 pp. 171–183, and Sec. 6.2, pp. 271–277.

*Primary Examiner*—Timothy P. Callahan
*Assistant Examiner*—Jung Ho Kim
*Attorney, Agent, or Firm*—Theodore E. Galanthay; Lisa K. Jorgenson; Gordon H. Telfer

[57] ABSTRACT

A voltage ramp generator for a driver circuit is provided to give an output that is highly linear between zero and a maximum voltage has a combination of current sources or generators for charging and discharging a capacitor, with discharging performed by sequencing two different types of current sources. A first current source on the discharge side of the capacitor has transistors in cascode connected current mirrors and takes the capacitor voltage to a low value but not as low as zero. A second current source of a basic or simple current mirror then takes the capacitor voltage substantially to zero. The voltage ramp generator meets the requirements of high performance, integrated, driver circuits, particularly for achieving complete turn-off of a power device such as a DMOS transistor in a high side cascoded transistors goes up to a threshold near the full supply driver. It is optional to have two current sources for charging, also, where a first source with voltage and than a second source, in a basic current mirror, continues charging substantially to the supply voltage.

15 Claims, 4 Drawing Sheets

DRIVER CIRCUIT INCLUDING SLEW RATE CONTROL SYSTEM WITH IMPROVED VOLTAGE RAMP GENERATOR

RELATED APPLICATIONS

This application is generally related in subject matter to the following applications by the same inventors and assigned to the same assignee which contain other inventions relevant to driver circuits: Ser. No. 08/740,129, filed Oct. 24, 1996, (Attorney's Docket No. 96-S-80); and Ser. No. 08/740,195, now U.S. Pat. No. 5,742,193, filed Oct. 24, 1996, (Attorney's Docket No. 96-S-81), both filed the same date as the present application.

BACKGROUND OF THE INVENTION

1. Field of the Invention

The invention relates to drive circuits for a power device of a power driving stage and particularly to a driver circuit operating from a supply voltage (e.g., a charge pump voltage) that is higher than the supply voltage of the power device.

The invention is particularly beneficial for high side drivers in integrated circuits for energizing spindle motor coils, such as for hard disk drives.

2. Description of Related Art

A driver circuit is generally a relatively low power circuit that drives, or controls, a higher power device. The power device may be part of a power driving stage for a load. An example is a load that is a motor, such as a brushless motor, that provides the motive force for a spindle of a hard disk drive. Similar driver circuits are applied elsewhere, such as in voice coil motor (VCM) systems.

One of the most widely used types of driver circuits in such applications uses a three-phase brushless motor in a configuration in which current energizes respective motor coils using a full wave bridge configuration. The bridge includes two power stages for each phase, so typically there are six power stages, each with a power device. Three of the power stages, and their power devices, are referred as being "low side" stages and devices because they are connected between a motor coil and ground. The other three of the power stages, and their power devices, are referred to as "high side" stages and devices because they are connected between a power supply and a motor coil.

The power devices are operated as switches in a sequence that allows pulses of current to flow from the power supply through a high side power device, a coil of a first of the three stages, a coil of a second of the three stages, and then through a low side power device to ground. This process is repeated in a generally well known manner for the other power devices and coil pairs to achieve three phase energization from a single, direct current, power supply. The switching, or commutation, characteristics of the power devices are very important in achieving good performance from the motor and other favorable characteristics.

Control of the switching of the power devices is performed by a driver circuit for each power device. In the typical use described above with six power stages, there are three low side drivers and three high side drivers. The power devices may be of a variety of electronic switch devices and the driver circuits are configured suitably for the power devices. Power devices of general application to hard disk drives, and the like, are each often an MOS (metal-oxide-semiconductor) FET (field effect transistor). One type of such transistors of considerable interest is referred to as a DMOS transistor (D referring to a double diffusion process used in its manufacture).

DMOS devices can be readily integrated in chips with other circuitry, including lower power control circuitry. So it is attractive to have an entire set of drive stages, including all the power devices and all the driver circuits for the power devices, in one chip.

Even where all the power devices are alike, e.g., N channel DMOS devices, it is generally the case that the high side drivers differ from the low side drivers because high side drivers for such power devices often require a voltage, referred to as a charge pump voltage or boost voltage, at a higher voltage level than that supplied by the power supply for the power stages. By known techniques, a charge pump voltage may be generated from the supply voltage and used by all the high side drivers. Such an auxiliary supply is, however, power limited; the desired voltage can be supplied but at a modest current level.

The state of the art in the field of motion control using integrated signal and power components, the respective requirements of low and high side drivers, and the characteristics sought in applications of motor drives are described more fully in *Smart Power ICs*, by B. Murari et al., Eds., 1995, particularly Chapter 5, "Motion Control" by R. Gariboldi, at pp. 225–283, which is herein incorporated by reference for its description of background to the present invention.

As is disclosed, for example from the above-mentioned Gariboldi publication, for applications such as hard disk drives it is of utmost importance to control the output voltage slope in order to reduce electromagnetic interference (EMI). Generally, the slope is desired to be steep, but not so abrupt as to cause any appreciable noise. Drive circuits have therefore generally included slew rate control circuits to achieve fast, smooth transitions.

In a typical slew rate control system, a capacitor is charged and discharged by two current generators. Preferably, one wishes to have the same smooth, linear commutation both in going off-to-on and on-to-off. Also, one wishes to have the gate voltage change over a range from ground, or zero, to the maximum supply voltage, or at least a voltage that assures full turn-on of the power device. The circuitry for doing so is referred to as a voltage ramp generator. It can be achieved, by typical integration techniques, using basic current mirrors, one of a pair of matched PNP bipolar transistors on the high side of the drive and the other of a pair of matched NPN bipolar transistors on the low side of the drive. Each pair of the transistor structures has one with a base-collector connection so the device acts as a diode. The diode is connected to the base of the other matched transistor. In some applications, this can produce good linearity between zero and a voltage equal to the supply voltage minus a bipolar transistor collector-emitter saturation voltage. Generally, problems in achieving the desired linearity increase as the supply voltage is increased. The greater precision with which linearity is achieved means the less noise can occur to affect the driver or its load.

An approach for attaining linearity at higher voltages than that for which the basic current mirror is suitable would be to use cascoded current mirrors. A description of basic and cascoded current mirrors and their use in constant-current stages is contained, for example, in *Bipolar and MOS Analog Integrated Circuit Design* by Alan B. Grebene, Sec. 4.1, pp. 170–183; incorporated herein by reference. However, a simple cascoded solution is not effective because it is not capable of ramping down to zero ground. A higher lower limit due to PN junction effects of the cascode connected transistors is inherently encountered. This is not suitable for a high performance drive.

Similar considerations apply if one considers using current mirrors or cascoded current mirrors of MOSFETs, which are metal-oxide-semiconductor-field-effect-transistors. Basic MOSFET current mirrors are also limited as far as providing good linearity in ramping with voltages encountered in integrated circuit charge pump supplies. Cascode connected MOSFETs provide a better degree of linearity but lack the ability to ramp down to a zero level to ensure turn off of a power device. There are inherent gate to source voltage drops that prevent a satisfactory reduction in voltage. The book of Grebene cited above also describes the nature and use of MOSFET current mirrors, e.g., Sec. 6.2, pp. 271–277, and is herein incorporated by reference.

SUMMARY OF THE INVENTION

To avoid the problems of the prior art in achieving accurate, precise slew rate control for devices such as spindle motor drives, an innovative voltage ramp generator has been developed. Here, discharging of the slew rate capacitor is achieved by a combination of different types of current sources that can be readily integrated in one chip.

Bipolar MOSFET current sources, in cascode connections, can be devised that are capable of good linear performance over a wide range of voltage. As discussed above in relation to the cascoded current mirrors, taking advantage of their linear characteristics may encounter limitations due to the inherent offset voltage of their structures. The present invention takes advantage of the combined characteristics of cascoded and basic current mirrors.

The voltage ramp generator of the invention discharges a slew rate control capacitor in two stages. A first low side, or discharging, current source discharges from the maximum voltage the capacitor reaches down to a low voltage above ground potential. The first low side source preferably includes bipolar elements. The low voltage reached by the first source may be equal, e.g., to 2 Vbe (base-emitter voltage drops) or about 1.5 v. A second low side, or discharging current source discharges the capacitor from the low voltage reached by the first source to ground. It comprises only a basic current mirror and is able to reach ground.

The circuit described above insures reaching a zero level with good linearity at a precise slew rate for complete turn-off of a power device when the voltage ramp generator is applied in a driver circuit. On the high voltage side, the ramp generator can often reach a high enough level, such as for full turn-on of a power device, despite some offset from the maximum supply voltage. However, the invention readily permits making a nearly true "rail-to-rail" voltage ramp generator whenever one is desired. In addition to having both a cascode connected current source and a basic current mirror current source for discharging the capacitor, there can be another combination of a cascode connected and basic current sources for charging the capacitor.

Utilizing the two current sources or current generators (cascode connected and basic) for discharging the capacitor can be vital to reach a low enough voltage (essentially zero) for turn-off of a power device, such as an N-channel DMOS device, in a high side driver. The impedance of the basic current mirror in the combination is not significant. In ramping up to the high voltage of the capacitor, the use of the two current sources is normally just an option.

The foregoing and additional aspects of the present invention will become more apparent from the following description and accompanying drawings.

DESCRIPTION OF PREFERRED EMBODIMENTS

Before describing embodiments of the invention, certain aspects of the background will be described in order to help in understanding the invention.

Figure 1:
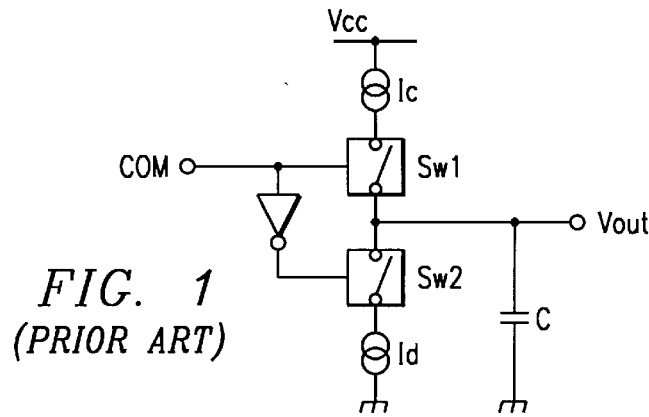
FIG. 1 is a circuit schematic of a voltage ramp generator in accordance with the prior art.

Referring to FIG. 1, a generalized schematic is shown of a prior voltage ramp generator. A DC supply of a voltage Vcc is applied across a combination of current generators and a capacitor C, which may, for example, be a slew rate control capacitor of a driver circuit. The current generators, also referred to as constant current sources, include a first current source Ic that is connected between the supply and the capacitor C for charging the capacitor. A second current source Id for discharging the capacitor C is connected to the capacitor's high side or charge terminal, as is source Ic, and to ground. A switch Sw is connected in a position to make or break a connection between source Ic and the capacitor C. Switch Sw is activated by command logic signals (COM) applied from other circuitry. A switch SW2 is connected to make or break a connection between source Id and capacitor C; it receives command signals through an inverter.

When a command signal is received to close Sw1, source Ic will charge up the capacitor to an elevated voltage near Vcc while Sw2 remains open. When a command signal is received to open Sw1, Sw2 closes and source Id will discharge C. Source Ic and source Id can each be designed to carry currents sufficient to provide substantially matching slew rates for the capacitor voltage Vout. For example, Ic and Id may each be designed to conduct a current of magnitude I. The slew rate or slope of the capacitor voltage Vout is therefore I/C both during charging and discharging.

Figure 2:
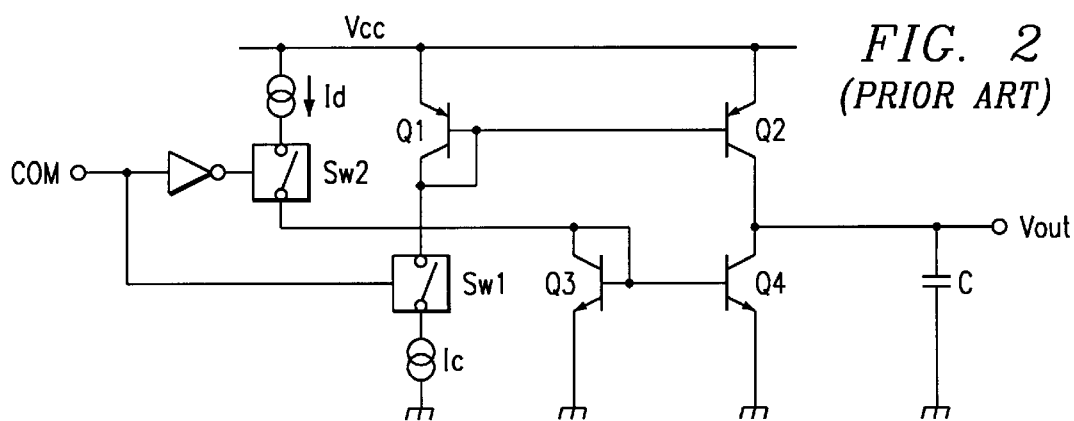
FIG. 2 is a circuit schematic further showing a combination in accordance with the prior art.

FIG. 2 illustrates a further example of a prior art voltage ramp generator and is a more specific example of the general configuration of FIG. 1. Relating the elements to FIG. 1, a charging source Ic comprises a pair of matched PNP transistor structures Q1 and Q2 connected as a basic current mirror between the supply Vcc and capacitor C. Transistor Q1 has a direct connection between its base and collector and operates as a diode. A discharging current source Id comprises a pair of matched NPN transistor structures Q3 and Q4. They are also connected as a basic current mirror and Q3 has its collector and base connected so it operates as a diode.

In the drawings, a symbol in the form of a pair of overlapping circles is used to represent a current source and to inform one that in addition to the illustrated transistors there are resistors and/or other elements for transistor biasing in accordance with known current source practice. The switches shown in the drawings may be suitable semiconductor switches, such as field effect transistors, in accordance with known practice.

Further information relating to various current sources for use in integrated circuits will be found in the above cited portions of the book by Grebene.

Figure 3:
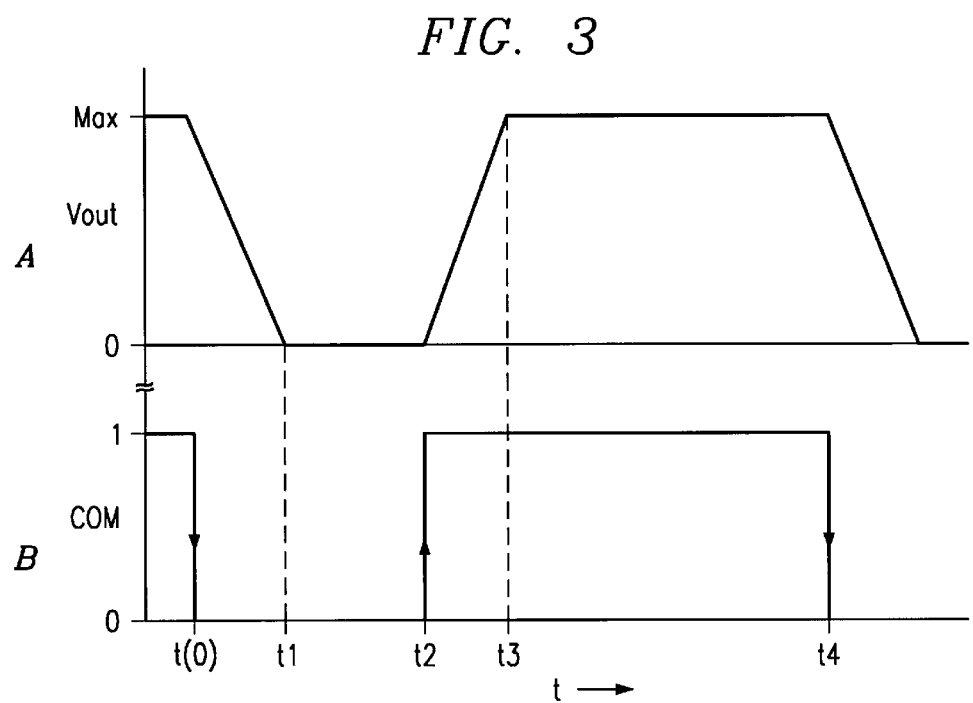
FIG. 3 is a set of waveforms illustrating voltage ramp performance in response to command signals.

FIG. 3 shows an example of performance sought to be realized by voltage ramp generators like those of FIG. 2. Part A of FIG. 3 shows changes in Vout occurring as a result of command signals (COM) shown in Part B on the same time axis. A command signal is either a logic "0" or "1". Here a "0" command is the signal to start discharging. The signal at time t(o) starts that process. The slew rate of Vout is I/C where I is the current of source Id. At time t1 the discharge is completed and Vout remains zero until a command signal of "1" is received at time t2. That starts the charging process with substantially the same slope or slew rate, but one determined by the current of source Ic. At time t3, Vout is at its maximum. Vout remains at that level until a further "0" command is received at time t4 and the discharge process begins again.

FIG. 3 is not intended to show exact values of Vout. For circuits such as FIG. 2, a maximum Vout is not quite the supply voltage Vcc but is equal to Vcc minus a collector-emitter saturation voltage (e.g., for Q2 of FIG. 2) of Vcesat. The minimum Vout is above ground voltage by an amount equal to the collector-emitter saturation voltage (e.g., for Q4 of FIG. 2).. The results achieved in FIG. 2 are generally suitable for driver circuits. The minimum Vout is effectively "zero" and sufficient to enable turning off a power device despite the voltage difference mentioned above.

As described in the background, the operation of some power stages requires a driver circuit operating from a voltage elevated above the power device supply Vcc, such as by about 10 v. The overvoltage, or charge pump voltage Vcp, can be generated in an integrated circuit from Vcc by known techniques. The higher voltage makes basic current mirrors like those of FIG. 2 perform their ramping functions with a less linear characteristic. In a straightforward integrated circuit design, the imposition of higher voltages on current sources could lead one to change from basic current mirrors as in FIG. 2 to cascode connected current mirrors. In contrast to FIG. 2 having a current mirror with transistor structures such as Q1 and Q2 in a current source, one could have two cascoded current mirrors in each current source both for changing and discharging. The extra transistors of the additional current mirrors are not appreciably difficult to integrate so the ability to achieve good linearity with higher output voltage may initially make cascoded current mirrors appear successful in satisfying the need of high performance driver circuits.

Operation of a voltage ramp generator with cascoded current mirrors, with for example a voltage Vcp about 10 v. higher than Vcc, is generally the same as the generator of FIG. 2 but with a serious drawback. The maximum voltage is not a major problem; ramping up to a voltage close enough to Vcp can usually be readily achieved. However, the minimum voltage is a serious problem. There should be no appreciable voltage at the minimum (i.e., Vout should be substantially "zero" in order to completely turn off the power device being driven). The extra voltage drop introduced by the cascoded current mirrors, as compared to a basic configuration as in FIG. 2, can be enough to prevent turn-off of the power device.

Figure 4:
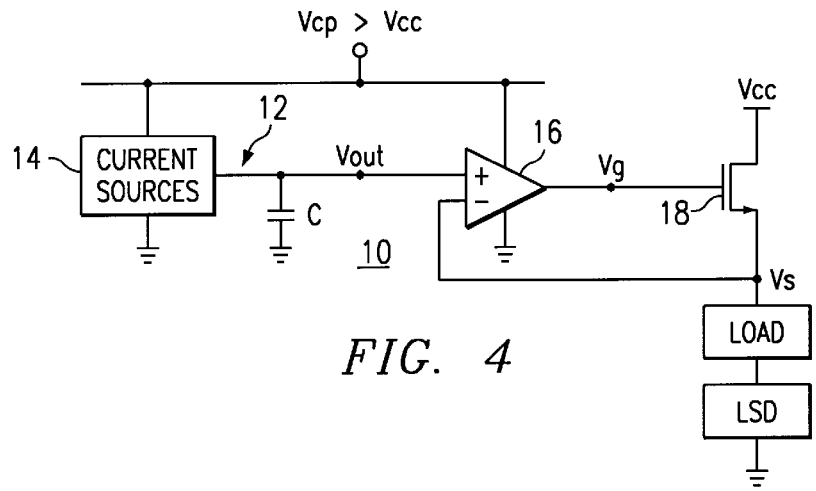
FIG. 4 is a circuit schematic of a driver circuit with a voltage ramp generator.

FIG. 4 helps to explain the need for a wide range of linearity in Vout. It shows schematically a drive circuit 10 comprising a voltage ramp generator 12 that includes capacitor C and current sources 14. The voltage ramp generator 12 serves as a slew rate control system for the driver circuit. The driver circuit 10 also has an amplifier (or op-amp) 16 which receives an input at one terminal that is Vout from the voltage ramp generator 12. The output from the amplifier 16 is the gate voltage Vg applied to a power device 18 which may be an N-channel DMOS device. Such a power device has a DC voltage applied to its channel by supply Vcc but requires that Vg range from zero, for complete turn-off, to a voltage substantially above Vcc for complete turn-on.

A second power supply Vcp supplies a DC voltage to the current sources 14 and biases the amplifier 16. Vcp is greater than Vcc due to the requirements for Vg.

FIG. 4 shows the driver circuit 10 as a high side driver for a load, such as spindle motor coils for a hard disk drive motor, which would have a low side driver, LSD, between it and ground. The driver output voltage Vs is applied to the load as well as back to an input of amplifier 16 as a feedback signal.

Basically, the voltage across the capacitor (Vout) is used to driver the power device 18. In order to turn off a power DMOS device, it is necessary to have a voltage between the gate and source of device 18 that is less that 1 volt. So it is very important that the voltage ramp generator provide a substantially "zero" Vout. However, if cascoded current mirrors are relied on as the only current sources in the voltage ramp generator, there is too much voltage drop of the low end of the slew voltage range to insure turn-off.

For driving device 18 on, Vg needs to go up to about 10 v. greater than Vcc. At the high end of the range, the cascoded mirrors would also cause an offset form Vcp due to voltage drops due to PN junction effects (about 2 Vbe) where cascoded current mirrors of bipolar transistors are used. That may be satisfactory because Vcp can still be high enough to ensure that Vg is enough for full turn-on.

The invention takes care of the ability of the voltage ramp generator to reach the required zero level. It can also be applied in an embodiment with additional capability at the high voltage side so Vout can match Vcp and provide an essentially full rail-to-rail ramp generator, without sacrificing the quality or precision of linearity at the desired slew rate.

Figure 5:
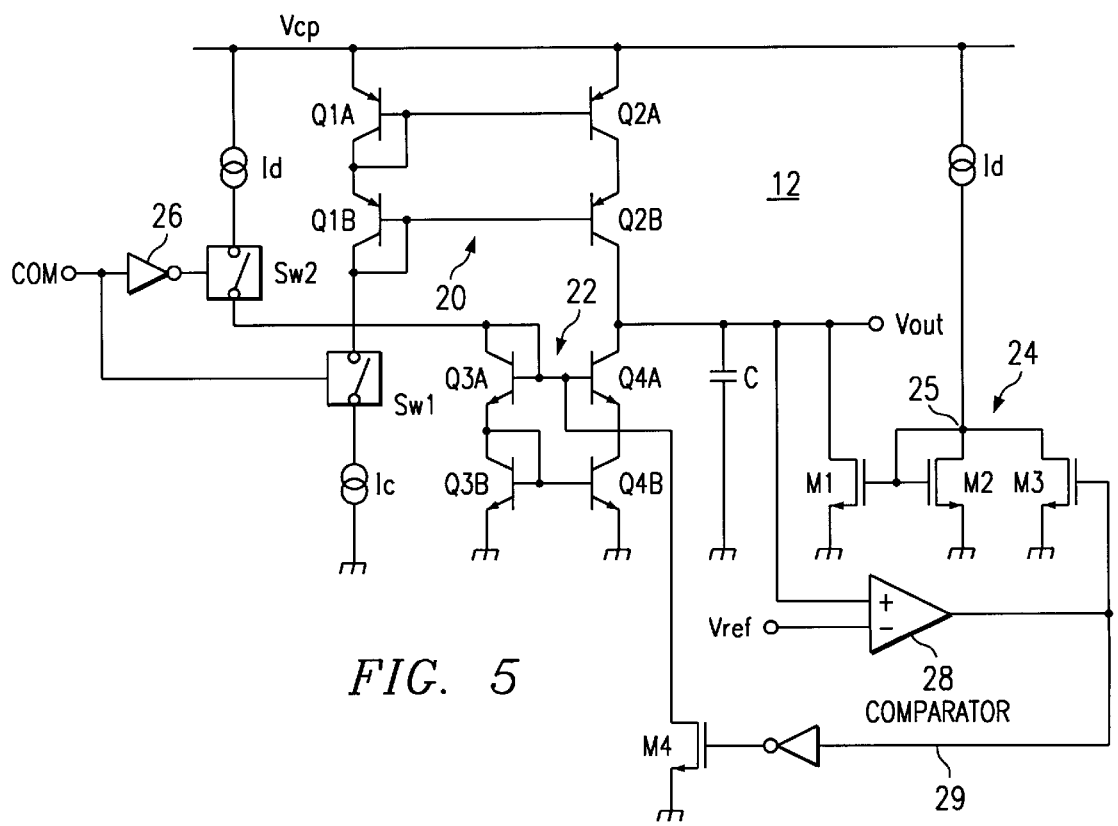
FIG. 5 is a circuit schematic of an embodiment of the present invention.

A voltage ramp generator 12 in accordance with an example of the present invention is illustrated in FIG. 5. It shows a capacitor C, such as a driver slew rate control capacitor, arranged to be charged and discharged in response to command signals by an innovative combination of current sources 20, 22, and 24. Each source is connected to an output line (Vout), (sometimes also referred to as the capacitor charge terminal, the high side of the capacitor C, or the common node).

Source 20 is connected to a power supply supplying a DC voltage Vcp that may be of a relatively large magnitude, such as at least about 27 v. Switch SW1 is closed or opened according to signals at the command terminal COM, which may be a logic "1" or "0". When switch SW1 is closed, current source 10 charges the capacitor C to a maximum voltage near Vcp.

Current sources 22 and 24 are operated for discharging the capacitor and reducing the output voltage. When switch Sw1 is opened, switch Sw2 is closed by a command to turn off at terminal COM. Inverter 26 is between COM and Sw2. The source 22 draws current from C to lower the voltage to a level near to but above zero. That level may be a few volts and be equivalent to two bipolar base-emitter saturation voltages, for example. At such a predetermined level, current source 24 draws current from the capacitor to lower the voltage to zero.

In implementing the invention, the current sources 20, 22, and 24 may individually use known current source techniques. For example, source 20 and source 22 may each be a cascode-connected pair of current mirrors.

Source 24, which completes the discharge of the capacitor to a substantially zero voltage, may for example be an MOS FET type of current source.

Current source 20 for charging the capacitor C has two bipolar transistor pairs with Q1A and Q2A in one current mirror and Q1B and Q2B in a second, the transistors being PNP type. Current source 22 for discharging the capacitor has two bipolar transistor pairs with Q3A and Q4A in one current mirror and Q3B and Q4B in a second, the transistors being NPN type. Each of transistors Q1A, Q1B, Q3A, and Q3B has a base-collector short so the structures operate as diodes.

Source 24 comprises field effect transistors M1, M2 and M3 that in this example are all N-channel devices. The channel of M1 is connected between Vout and ground with its gate connected to the gate of M2 and to a supply node 25. The channel of M2 is connected between the supply node 25 and ground. M3 also has its channel connected between the supply node 25 and ground. The gate and drain of M2 are shorted. M1 and M2 are connected in a basic current mirror.

The gate of M3 is connected so that discharging source 24 starts conducting when source 22 has brought Vout down to the predetermined low level. MOSFET M4 and an inverter are in a circuit branch 29 connected between the output of comparator 28 and a node between the base of Q3A and the base of Q4A in source 22; this ensures source 22 is turned off when source 24 is turned on.

For correct sequencing of the discharge current sources 22 and 24, the example embodiment of FIG. 5 has a comparator 28 with a pair of input voltage signals. A first, positive, input terminal of comparator 28 receives the output voltage, which is the voltage on the capacitor C. The second, negative, input terminal of comparator 28 receives a reference voltage Vref. Vref is chosen to be a voltage enough above zero to be in the range in which source 12 is capable of efficient linear ramping of the voltage, about 2 Vbe or slightly more. It is preferred that Vref be relatively small so the source 24 is required to conduct only over a small voltage. That is because it is more difficult to make sources in the form of a basic current mirror, like 24, that have as good linearity as sources with cascoded current mirrors, like 22.

Comparator 28 is arranged so source 24 remains off until Vout falls to Vref. Then a signal from the comparator initiates conduction by the devices of source 24 so the discharge to zero is completed.

The embodiment of FIG. 5 satisfies the need for ramping down to substantially zero so a driver like that of FIG. 4 can be reliably turned off. The embodiment of FIG. 5 (and also that of FIG. 8) does not provide for ramping up to a voltage closer than about 2 Vbe (two times the base-emitter voltage drop of a bipolar transistor or about 2 to 3 v.). As explained previously, that is satisfactory so long as Vcp-2 Vbe is enough so Vg in FIG. 4 can achieve full turn-on of device 18.

A further aspect of the invention is to have full rail-to-rail (substantially 0 to substantially Vcp) operation in any circuit application where desired. That may be in a case where the voltage magnitude of the available Vcp minus 2 Vbe is not large enough to ensure that Vg reaches a high enough level.

Figure 6:
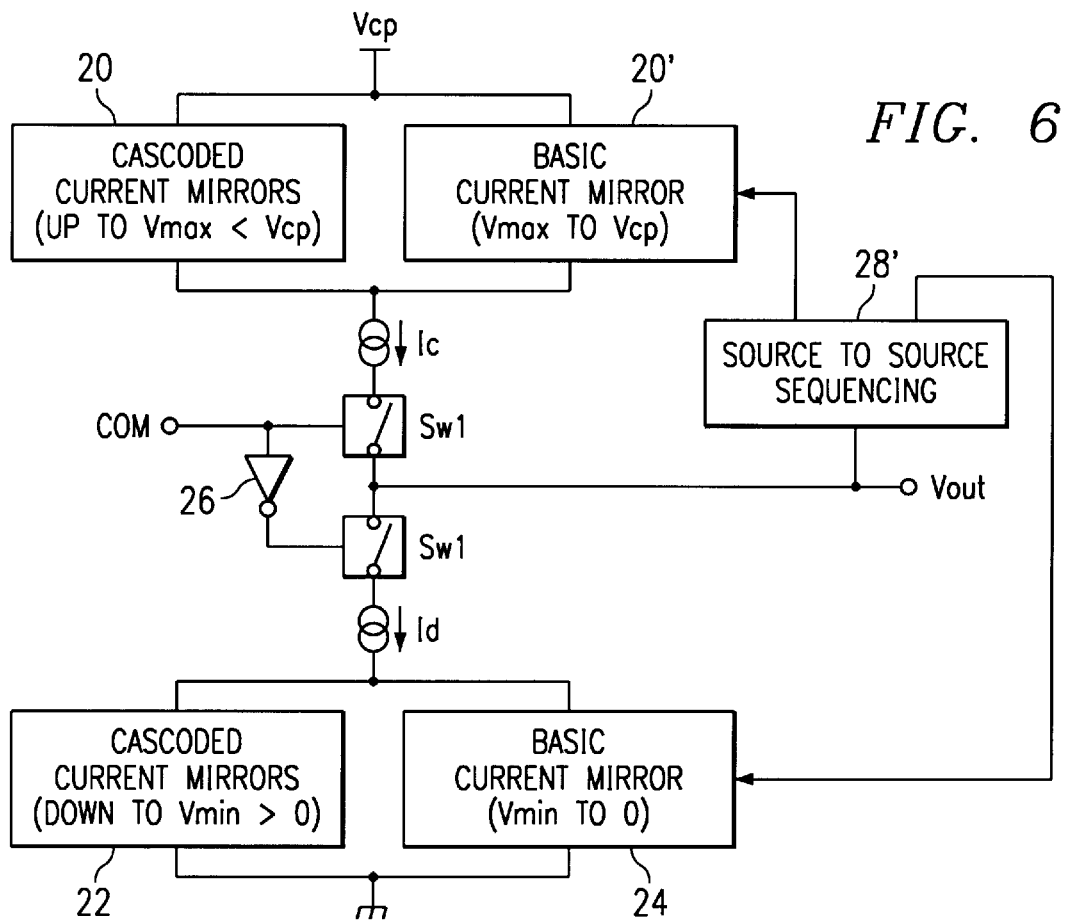
FIG. 6 is a generalized schematic of some embodiments of the invention.

FIG. 6 illustrates a general embodiment for a full rail-to-rail voltage ramp generator. Relating it to FIG. 5, current sources 20 and 22, current source 24, switches Sw1 and Sw2, and inverter 26 are consistent with FIG. 5 and illustrate the basic elements for achieving Vout down to substantially zero. In addition, FIG. 6 shows an additional basic current mirror current source 20' to conduct from a Vmax limit for source 20 in order to get Vout up to substantially Vcp. Charging source 20' may be configured similarly to discharging source 24 of FIG. 5, with correct polarity elements. FIG. 6 has a block 28' for Source to Source Sequencing elements connected at Vout. Block 28' would include whatever elements detect the level of Vout at which conduction of source 20' or 24 is to begin. It could include a comparator such as 28 of FIG. 5 plus a similar comparator arrangement for the charging source 20' where an input reference compared to Vout would be Vcp-2 Vbe.

In the context of the present invention, the voltage drop of a basic current mirror is low enough to ignore, even though not absolutely zero. On the other hand, cascode connected current mirrors impose a voltage drop of a magnitude that can be substantially avoided by switching from a cascode connected current mirror to a basic current mirror. The choice of use of bipolar or MOSFET sources may generally be made in accordance with ease of fabrication or other factors not directly pertaining to the invention. The example of FIG. 5 with cascoded bipolar current mirrors in source 22 and a basic current mirror of MOSFETs in source 24 is one combination that can be readily made in a moderate chip area and performs well.

Figure 7:
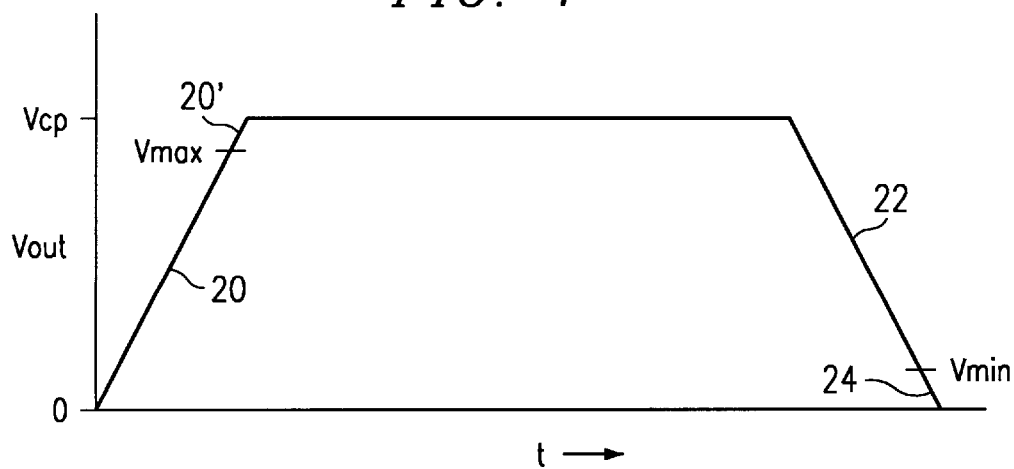
FIG. 7 is a waveform illustrating performance of voltage ramp generators such as those of FIG. 6.

FIG. 7 is a waveform for summarizing the performance of FIG. 6. Vout ranges on both charging and discharging from 0 to Vcp. Vmin and Vmax represent the limits of the cascode connected current sources 20 and 22. The invention shifts smoothly from operation of a cascoded source to a basic source as, or just before, the limit of the cascoded source is reached. Vmin and Vmax can be about 2 Vbe away from 0 and Vcp.

The reference numbers on sections of FIG. 7 correspond to the current sources operating at that time. As Vout ramps up, the range from 0 to Vmax is provided by source 20 and from Vmax to Vcp by source 20'. On ramping down, source 22 operates to get from Vcp to Vmin and source 24 from Vmin to zero. Again it is noted a principal point is to take advantage of the high linearity of cascode connected current mirrors over most of the voltage range while, at least on discharge (but also as desired on charging up) using the lower voltage drop of a basic current mirror to get down substantially to zero (and also optionally to get up substantially Vcp).

The performance of FIG. 6 be favorably compared to FIG. 3. Vout will have linear slope between 0 and Vcp, without any offset at either extreme due to junction voltage drops. Any slight nonlinearity near ground or Vcp, due to the basic current sources, is not of serious consequence. This contrasts with the unsatisfactory performance that results if only cascoded sources are used; particularly the inability to discharge the voltage to zero.

The invention therefore uses advantageous features of known technology in an innovative way to provide a highly linear, substantially rail-to-rail voltage ramp generator, such as for high side drivers in apparatus such as disk drives. Further description and illustration of such an application will be found in one of the above-mentioned copending applications by the present inventors, Ser. No. 08/740,129, (Attys Docket 96-S-080). Said application is herein incorporated by reference for its description of such drivers in general and for its description of the advantageous use of the present invention together with other driver circuit improvements. Furthermore, the other above-mentioned application, Ser. No. 08/740,195, now U.S. Pat. No. 5,742,193 (Atty's Docket 96-S-81) is incorporated hereby by reference for its description of preslewing techniques.

The voltage ramp generator of the present invention can be programmable in the sense that the slop I/C may be selected from among varied values. All of the operative elements can be readily integrated by standard techniques. A single chip may be made to have current sources providing different levels of current, I, and/or different values of capacitance C with ability to select whichever I and C values are desired for a particular application.

Figure 8:
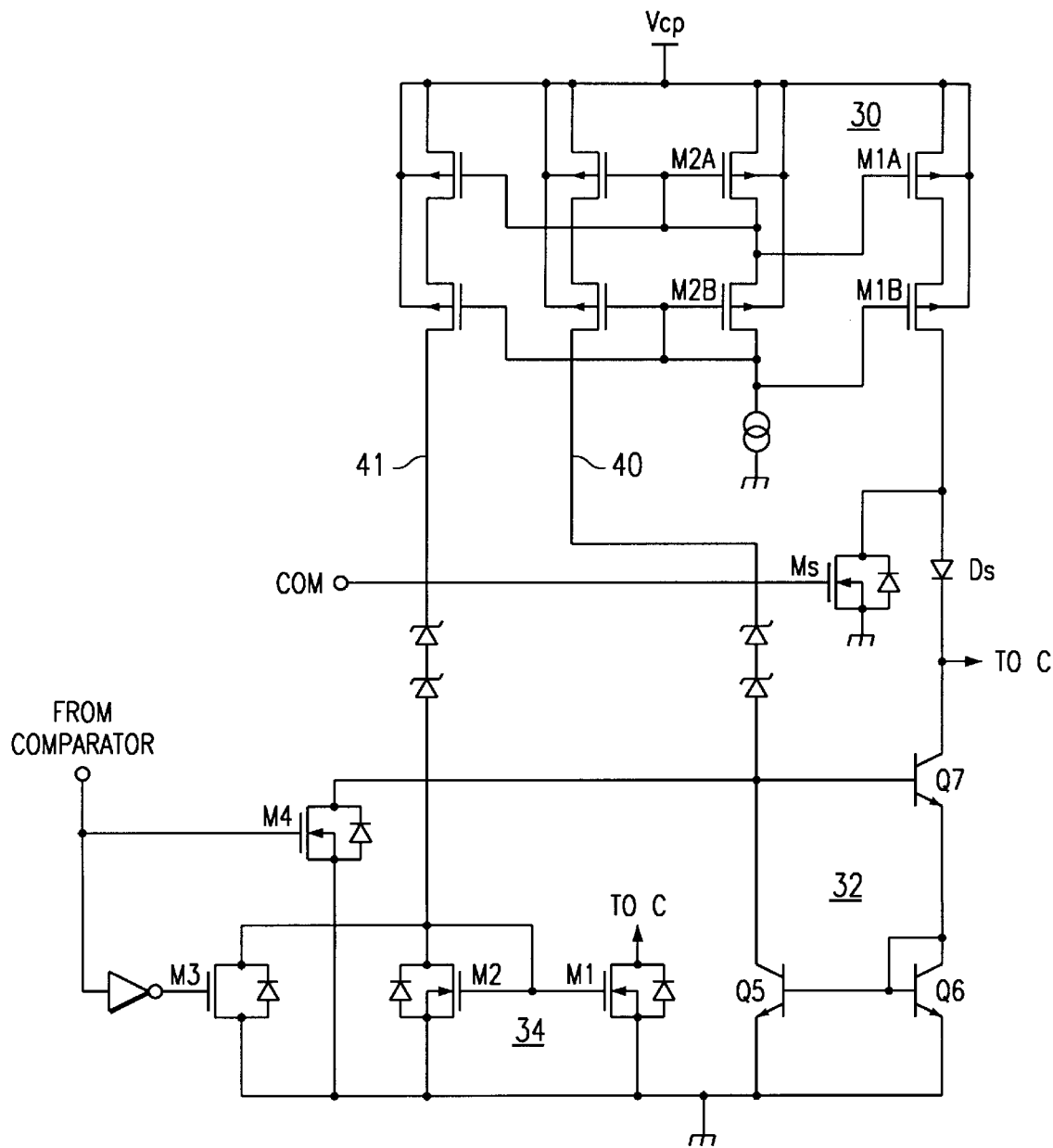
FIG. 8 is a more detailed circuit schematic for an embodiment of the invention.

FIG. 8 is an arrangement in which current source or current generator 30 is for charging up the capacitor and comprises cascode connected MOSFET current mirrors, here PMOS devices with the drawing showing their bulk connections to Vcp. Transistors M1A and M2A are in one current mirror and M1B and M2B are in another with M2A and M2B having connections between their gates and one end of their channels (drains).

An N-channel MOS transistor Ms has its gate connected to the command terminal COM and with diode Ds connected between source 30 and source 32 performs the switching functions in response to high or low command signals.

A first discharging current source 32 is shown that has NPN transistors Q5, Q6 and Q7 connected in a cascoded current mirror. This is a three transistor configuration in contrast to the four transistors shown in source 22 of FIG. 5. However, the basic performance is very similar. Source 32 can, with good linearity, ramp down only to a minimum voltage that is not close enough to zero to assure turn-off of a power device, such as device 18 in FIG. 4.

Source 34 includes a basic current mirror of N-channel MOSFETs M1 and M2 connected like the same numbered elements of FIG. 5. M3 and M4 in FIG. 8 also correspond to the like numbered elements of FIG. 5. In this example, the comparator signal goes to the gate of M4 and through air inverter to the gate of M3.

Other components shown in FIG. 8 include branches 40 and 41 with a pair of N-channel devices and a pair of Zener diodes in each with the illustrated connections for biasing and operation of the respective discharging current sources 32 and 34.

FIG. 8 is representative of an application of the invention in a slew rate control system of a high side driver such as that of FIG. 4. FIG. 8 is also representative of circuitry that can be integrated with both P-channel and N-channel MOS devices and with bipolar transistors. So there is considerable flexibility in selecting components for the building blocks applicable to the invention.

It will be apparent that the invention may be practiced in forms in addition to those shown and described herein.

What is claimed is:

1. A voltage ramp generator for charging and discharging of a capacitor for slew rate control of a power driving stage comprising:

means for charging to a predetermined maximum voltage;

means for discharging to a predetermined minimum ground voltage;

the means for discharging comprising a first current source arranged for discharging from the maximum voltage down to a predetermined low voltage above the ground voltage and a second current source arranged for discharging from the low voltage down substantially to the ground voltage.

2. The voltage ramp generator of claim 1 wherein:

the first current source for discharging comprises cascode connected transistor elements; and the second current source for discharging comprises transistor elements in a basic current mirror.

3. The voltage ramp generator of claim 2 wherein:

the means for discharging further comprises a means for sensing when the ramped voltage is discharged to the predetermined low voltage and for activating the second current source for discharging.

4. A voltage ramp generator, for linearly ramping voltage between a zero or ground voltage and a maximum voltage, comprising:

a plurality of constant current sources;

switch means for selectively connecting respective current sources to an output node where a capacitor to be charged and discharged is connected;

the current sources including a high side source for charging the capacitor to the maximum voltage when the switch means receives a turn-on command signal, the switch means being arranged to open the circuit of the high side source by a turn-off command signal;

the current sources including two low side sources for discharging the capacitor;

a first low side source being arranged to discharge the capacitor to a predetermined low voltage above ground voltage when the switch means receives a turn-off command signal; and a second low side source being arranged to discharge the capacitor to ground voltage in response to the capacitor having been discharged to the predetermined low voltage.

5. The voltage ramp generator of claim 4 wherein:

the first low side source comprises bipolar transistor elements and the second low side source comprises field effect transistor elements.

6. The voltage ramp generator of claim 5 wherein:

the first low side source is characterized by exhibiting highly linear voltage ramping down to the predetermined low voltage and the second low side source is characterized by having a capability of voltage ramping to lower voltage than that to which the first low side source is capable.

7. A driver circuit, for a power driving stage with a power device, comprising:

an amplifier having an output connected to a control terminal of the power device; and a slew rate control system with an output node connected to an input terminal of the amplifier;

the slew rate control system comprising a capacitor with a charge terminal connected to the slew rate output node and also a ground terminal connected to a ground potential, and a voltage ramp generator for charging and discharging the capacitor in response to command signals, wherein the voltage ramp generator comprises:

first, second and third current sources;

the first current source being connected at one terminal to a power supply supplying a voltage of a magnitude that is a maximum required for operating the power device, the first current source being connected at a second terminal to the capacitor charge terminal, the first current source being arranged to conduct when the capacitor is to be charged and to not conduct when the capacitor is to be discharged in response to respective on and off command signals, the second current source being connected at a first terminal to ground potential and at a second terminal to the capacitor charge terminal, the second current source being arranged to conduct and to discharge the capacitor to a low voltage level and to not conduct when the low voltage level is reached;

the third current source being connected at a first terminal to ground potential and at a second terminal to the capacitor charge terminal, the third switch being arranged to conduct and to discharge the capacitor to ground potential when the low voltage level is reached.

8. A drive circuit in accordance with claim 7 wherein:

the second current source comprises bipolar transistor elements connected in a cascoded current mirror configuration.

9. A driver circuit in accordance with claim 8 wherein:

the third current source comprises field effect transistor elements connected in a basic current mirror configuration.

10. A voltage ramp generator, suitable for slew rate control in a driver circuit, comprising:

a capacitance;

means for charging the capacitance; and means for discharging the capacitance;

at least one of the means for charging and the means for discharging being a combination comprising a current source of cascode connected current mirrors and a current source of a basic current mirror with means for initiating conduction of the basic current mirror current source when the cascode connected current source has reached a predetermined limit.

11. The voltage ramp generator of claim 10 wherein:

the means for charging and the means for discharging are connected between a DC power supply and a ground; and each of the means for charging and the means for discharging comprises a respective cascode connected current source and a respective basic current mirror current source.

12. The voltage ramp generator of claim 10 wherein:

the means for charging and the means for discharging are connected between a DC power supply and a ground;

the means for discharging comprises said combination and discharges the capacitance to a substantially zero level; and the means for charging comprises only a cascade connected current source.

13. A method of operating a voltage ramp generator for slew rate control in a driver circuit, comprising:

detecting ON and OFF commands to change the state of the driver circuit;

charging a capacitance to a maximum voltage of a sufficiently large magnitude of driver circuit operation in the ON state when an ON command is detected; and discharging the capacitance to a minimum voltage of a sufficiently low magnitude for placing the driver circuit in the OFF state when an OFF command is detected, the discharging occurring in two stages wherein discharging down from the maximum voltage is performed initially by a first current source with an appreciable inherent minimum voltage drop to a first intermediate voltage that has a magnitude above the sufficiently low magnitude and further discharging is performed down to the sufficiently low magnitude by a second current source without an appreciable inherent minimum voltage drop.

14. The method of claim 13 wherein:

the discharging by the first current source is performed by cascode connected current mirrors and the discharging by the second current source is performed by a basic current mirror.

15. The method of claim 13 wherein:

the discharging is performed by a first current source of bipolar transistor elements and a second current source of field effect transistor elements.

* * * * *

UNITED STATES PATENT AND TRADEMARK OFFICE

CERTIFICATE OF CORRECTION

PATENT NO.    :    5,825,218

DATED         :    October 20, 1998

INVENTOR(S)   :    Gianluca Colli and Massimiliano Brambilla

It is certified that error appears in the above-identified patent and that said Letters Patent is hereby corrected as shown below:

On the cover page, item [57] Column 2, delete ABSTRACT in its entirety and substitute the following:

> A voltage ramp generator for a driver circuit is provided to give an output that is highly linear between zero and a maximum voltage by a combination of current sources or generators for charging and discharging a capacitor, with discharging performed by sequencing two different types of current sources. A first current source on the discharge side of the capacitor has transistors in cascode connected current mirrors and takes the capacitor voltage to a low value but not as low as zero. A second current source of a basic or simple current mirror then takes the capacitor voltage substantially to zero. The voltage ramp generator meets the requirements of high performance, integrated, driver circuits, particularly for achieving complete turn-off of a power device such as a DMOS transistor in a high side driver. It is optional to have two current sources for charging, also, where a first source with cascoded transistors goes up to a threshold near the full supply voltage and then a second source, in a basic current mirror, continues charging substantially to the supply voltage.

In the specification:

Column 1, line 60, cancel "use" and substitute --case--.

Column 4, line 37, cancel "Sw" and substitute --Sw1--.

Column 4, line 39, cancel "Sw" and substitute --Sw1--.

UNITED STATES PATENT AND TRADEMARK OFFICE
CERTIFICATE OF CORRECTION

PATENT NO. : 5,825,218

DATED : October 20, 1998

INVENTOR(S) : Gianluca Colli and Massimiliano Brambilla

It is certified that error appears in the above-identified patent and that said Letters Patent is hereby corrected as shown below:

Column 5, line 49, cancel "changing" and substitute --charging--.

Column 6, line 25, cancel "driver" and substitute --drive--.

Column 6, line 31, cancel "of" and substitute --from--.

Column 6, line 62, cancel "10" and substitute --20--.

Column 7, line 45, cancel "12" and substitute --22--.

UNITED STATES PATENT AND TRADEMARK OFFICE
CERTIFICATE OF CORRECTION

PATENT NO. : 5,825,218
DATED : October 20, 1998
INVENTOR(S) : Gianluca Colli and Massimiliano Brambilla It is certified that error appears in the above-identified patent and that said Letters Patent is hereby corrected as shown below:

Column 8, line 54, after "substantially" insert --to--.

Column 8, line 55, after "6", insert --can--.

Column 9, line 12, cancel "slop" and substitute --slope--.

Column 9, line 44, cancel "air" and substitute --an--.

In the claims:

Column 11, Claim 7, line 16, cancel "switch" and substitute --current source--.

Column 12, Claim 12, line 12, cancel "cascade" and substitute --cascode--.

Column 12, Claim 13, line 19, cancel "of" and substitute --for--.

Signed and Sealed this

Thirtieth Day of March, 1999

Attest:

*Attesting Officer*

Q. TODD DICKINSON

*Acting Commissioner of Patents and Trademarks*